United States Patent [19]

Miwada

[11] Patent Number: 5,173,757
[45] Date of Patent: Dec. 22, 1992

[54] CHARGE DETECTION CIRCUIT FOR USE IN CHARGE TRANSFER DEVICE

[75] Inventor: Kazuo Miwada, Tokyo, Japan

[73] Assignee: NEC Corporation, Tokyo, Japan

[21] Appl. No.: 697,159

[22] Filed: May 8, 1991

[30] Foreign Application Priority Data

May 8, 1990 [JP] Japan .................................. 2-118170

[51] Int. Cl.$^5$ ...................... H01L 29/78; H01L 27/14; H01L 27/02
[52] U.S. Cl. .................................. 257/215; 257/225; 257/239; 257/245
[58] Field of Search ........................ 357/24, 30, 41, 91

*Primary Examiner*—Mark V. Prenty
*Attorney, Agent, or Firm*—Sughrue, Mion, Zinn, Macpeak & Seas

[57] ABSTRACT

A charge transfer device includes a pair of charge transfer registers which receive signal charges from a photo sensor cell array and which transfer the received signal charges in the same direction along the charge tranfer registers, and a floating diffusion type charge reading section for reading the signal charges alternately from final stages of the pair of charge transfer registers. A signal charge detection circuit includes an output gate assembly provided between the final stage of each of the pair of charge transfer registers and a floating diffusion. A reading circuit operates to cause the signal charges alternately read from the final stages of the pair of charge transfer registers, to flow through a single channel under formed the output gate assembly, into the floating diffusion. An electric field is formed in the channel formed under the output gate assembly, so as to forcibly guide the signal charge from the final stage of each of the pair of charge transfer registers to the floating diffusion.

6 Claims, 6 Drawing Sheets

CHARGE DETECTION CIRCUIT FOR USE IN CHARGE TRANSFER DEVICE

BACKGROUND OF THE INVENTION

1. Field of the Invention

The present invention relates to a charge transfer device for use in a linear image sensor, and more specifically to an output structure of a common signal charge detection circuit for alternately picking up signal charges transferred by a pair of CCD (charge coupled device) shift registers.

2. Description of Related Art

One typical conventional linear image sensor using a CCD shift register has been disclosed in Japanese Patent Application Laid-open No. Sho 59-221176. The linear image sensor disclosed in the Japanese patent application comprises an image sensor cell array composed of a plurality of image sensor cells formed and arranged in a straight line on a semiconductor substrate of one conduction type. A pair of elongated transfer electrodes are located along the image sensor cell array and at opposite sides of the image sensor cell array. In addition, a pair of CCD shift registers are located at the outside of each of the elongated transfer electrodes and in parallel to the elongated transfer electrodes. With this arrangement, signal charges stored in the image sensor cell array are transferred to the pair of CCD shift registers under control of the elongated transfer electrodes in such a manner that signal charges stored in odd-numbered image sensor cells are transferred to a first one of the pair of CCD shift registers, and signal charges stored in even-numbered image sensor cells are transferred to a second one of the pair of CCD shift registers.

The signal charges transferred to each CCD shift register are transferred through the CCD shift register, and serially outputted from an output gate electrode provided in common adjacent to a final stage of the pair of CCD shift registers.

A floating diffusion is provided adjacent to the output gate electrode, in common to the final stage of the first CCD shift register and the final stage of the second CCD shift register. For example, the floating diffusion is in the form of a Y-shape having a first end adjacent to the final stage of the first CCD shift register through the output gate electrode, a second end adjacent to the final stage of the second CCD shift register through the output gate electrode, and a third end adjacent to a reset electrode.

With this arrangement, the signal charges transferred through the first CCD shift register and the signal charges transferred through the second CCD shift register are joined at the Y-shaped floating diffusion, so that signal charges detected in the linearly arranged image sensor cells are serially and sequentially are transferred to the Y-shaped floating diffusion in the order of the image sensor cells.

In addition, an output drain is provided adjacent to the reset electrode. The reset electrode is used to bring a potential of the floating diffusion to the same as that of the output drain before each time the signal charge is transferred to the floating diffusion. The floating diffusion is connected to a gate of a first MOS transistor, which has a drain connected to the output drain and a source connected to an output terminal and an active load formed of for example a second MOS transistor, so that a source follower is formed.

In the above mentioned signal charge detecting circuit, a detection voltage Vout obtained from the output terminal (namely, the source of the first MOS transistor) can be expressed as follows:

$$V_{out} = \{Q/(C_o + C_M)\} \times G \quad (1)$$

where
  Q is the amount of the signal electric charge flowing into the floating diffusion;
  G is a gain of the source follower formed of the first and second MOS transistors;
  $C_o$ is a capacitance of the floating diffusion; and
  $C_M$ is an input capacitance of the first MOS transistor.

In ordinary cases, the gain G is as low as 0.9. In addition, $C_M$ has a limit attributable to a circuit construction of the source follower. Therefore, in order to increase the output voltage Vout for a constant amount Q of the signal electric charge (namely, a electric charge/voltage conversion gain), it is necessary to decrease the capacitance $C_o$.

Here, consider the detail of the capacitance $C_o$. Assuming that the semiconductor substrate is of P-type and the floating diffusion is of N-type, since the signal charge output circuit operates by applying a reverse bias between the floating diffusion and the P-type substrate, a junction capacitance Csub is formed between the floating diffusion and the P-type substrate. In addition, a coupling capacitance $C_{OG}$ exists between the floating diffusion and the output gate electrode, and a coupling capacitance $C_R$ exists between the floating diffusion and the reset electrode.

Furthermore, since the floating diffusion is confined at both sides thereof by a pair of P-type channel stoppers, a junction capacitance Ccs is formed between the floating diffusion and each P-type channel stopper.

Therefore, the capacitance $C_o$ of the floating diffusion can be expressed:

$$C_o = C_{sub} + C_{cs} + C_{OG} + C_R \quad (2)$$

However, in the conventional signal charge detection structure of the charge transfer device, it has been difficult to reduce the capacitance $C_o$ of the floating diffusion, since there has been a limit in reducing an area of the floating diffusion, for the following reason:

Namely, in the conventional signal charge detection structure of the charge transfer device, the signal charges separately outputted from one pair of CCD shift registers are caused to flow, through different channels formed under the output gates, to a common floating diffusion, as mentioned hereinbefore. Therefore, the floating diffusion has been required to be located adjacent to the output gate at two different positions. On the other hand, the floating diffusion has been required to be located adjacent to the reset electrode for resetting the floating diffusion. As a result, the floating diffusion must have been in the Y-shaped form, and therefore, there has been a limit in reducing the area of the floating diffusion.

SUMMARY OF THE INVENTION

Accordingly, it is an object of the present invention to provide a signal charge detection circuit of the charge transfer device, which has overcome the above mentioned defect of the conventional one.

Another object of the present invention is to provide a signal charge detection circuit of the charge transfer device, having a reduced area of the floating diffusion and a high electric charge/voltage conversion gain.

The above and other objects of the present invention are achieved in accordance with the present invention by a signal charge detection circuit for use in a charge transfer device. The charge transfer device includes a pair of charge transfer registers which receive signal charges from a photo sensor cell array and which transfer the received signal charges in the same direction along the charge transfer registers, and a floating diffusion type charge reading section for reading the signal charges alternately from final stages of the pair of charge transfer registers. The signal charge detection circuit includes an output gate means provided between the final stage of each of the pair of charge transfer registers and a floating diffusion means for causing the signal charges alternately read from the final stages of the pair of charge transfer registers, to flow through a single channel formed under the output gate means, into the floating diffusion, and means for forming an electric field in the channel formed under the output gate means, the electric field acting to forcibly guide the signal charge from the final stage of each of the pair of charge transfer registers to the floating diffusion.

The above and other objects, features and advantages of the present invention will be apparent from the following description of preferred embodiments of the invention with reference to the accompanying drawings.

DESCRIPTION OF THE PREFERRED EMBODIMENTS

Figure 1:
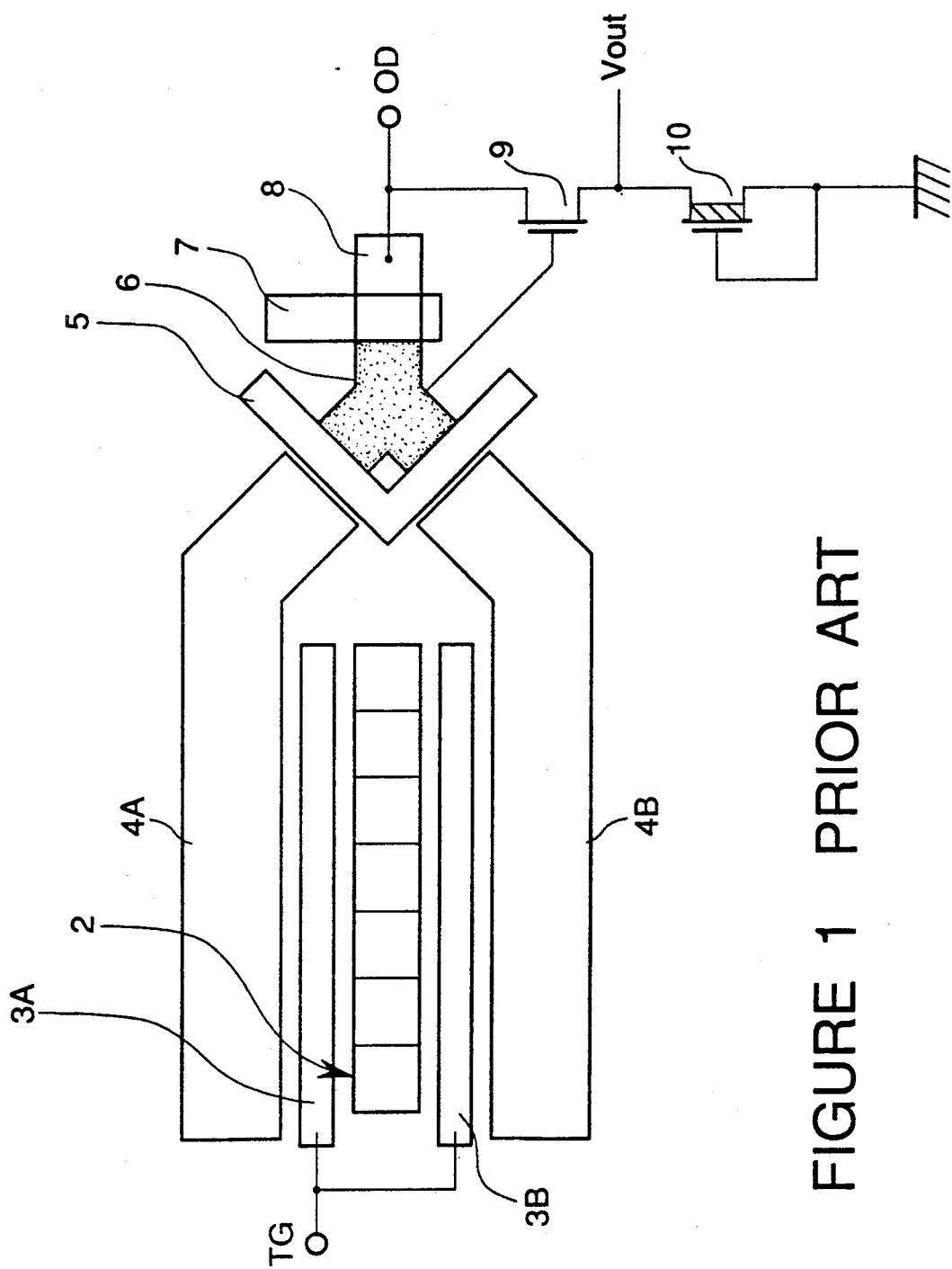
FIG. 1 is a diagrammatic plan view illustrating a typical conventional linear image sensor having a CCD shift register.

Referring to FIG. 1, there is shown a diagrammatic plan view illustrating a typical conventional linear image sensor having a CCD shift register.

The shown typical conventional linear image sensor comprises an image sensor cell array 2 composed of a plurality of image sensor cells formed and arranged in a straight line on a semiconductor substrate 1 of for example P-type. A pair of elongated transfer electrodes 3A and 3B are located along the image sensor cell array 2 in such a manner that one of the elongated transfer electrodes 3A is positioned adjacent to one side of the image sensor cell array 2, and the other elongated transfer electrode 3B is positioned adjacent to the other side of the image sensor cell array 2. In addition, a pair of CCD shift registers 4A and 4B are located at the outside of each of the elongated transfer electrodes 3A and 3B and in parallel to the elongated transfer electrodes 3A and 3B, so that, for example, signal charges stored in odd-numbered image sensor cells are transferred through the transfer electrode 3A to the CCD shift register 4A, and signal charges stored in even-numbered image sensor cells are transferred through the transfer electrode 3B to the CCD shift register 4B.

The signal charges transferred to the CCD shift registers 4A and 4B are transferred through the CCD shift registers 4A and 4B, respectively, and serially outputted from an output gate electrode 5 provided adjacent to a final stage of each CCD shift register.

A floating diffusion 6 is provided adjacent to the output gate electrode 5, in common to the final stage of first CCD shift register 4A and the final stage of the second CCD shift register 4B. As shown in FIG. 1, the floating diffusion 6 is in the form of a Y-shape having a first end adjacent to the final stage of the first CCD shift register 4A through the output gate electrode 5, and a second end adjacent to the final stage of the second CCD shift register 4B through the output gate electrode 5. A third end of the Y-shape floating diffusion 6 is adjacent to a reset electrode 7, and an output drain 8 is provided adjacent to the reset electrode 8. The floating diffusion 6 is connected to a gate of a first MOS transistor 9, which has a drain connected to the output drain 8 and a source connected to an output terminal Vout and grounded through an active load formed of a second MOS transistor 10.

It would be understood from FIG. 1 that the capacitance Co of the floating diffusion 6 includes Csub, Ccs, $C_{OG}$ and $C_R$ as shown in the above mentioned equation (2), and that in the conventional signal charge detection structure of the charge transfer device, it has been difficult to reduce the capacitance Co of the floating diffusion, because there has been a limit in reducing the area of the floating diffusion 6.

Figure 2:
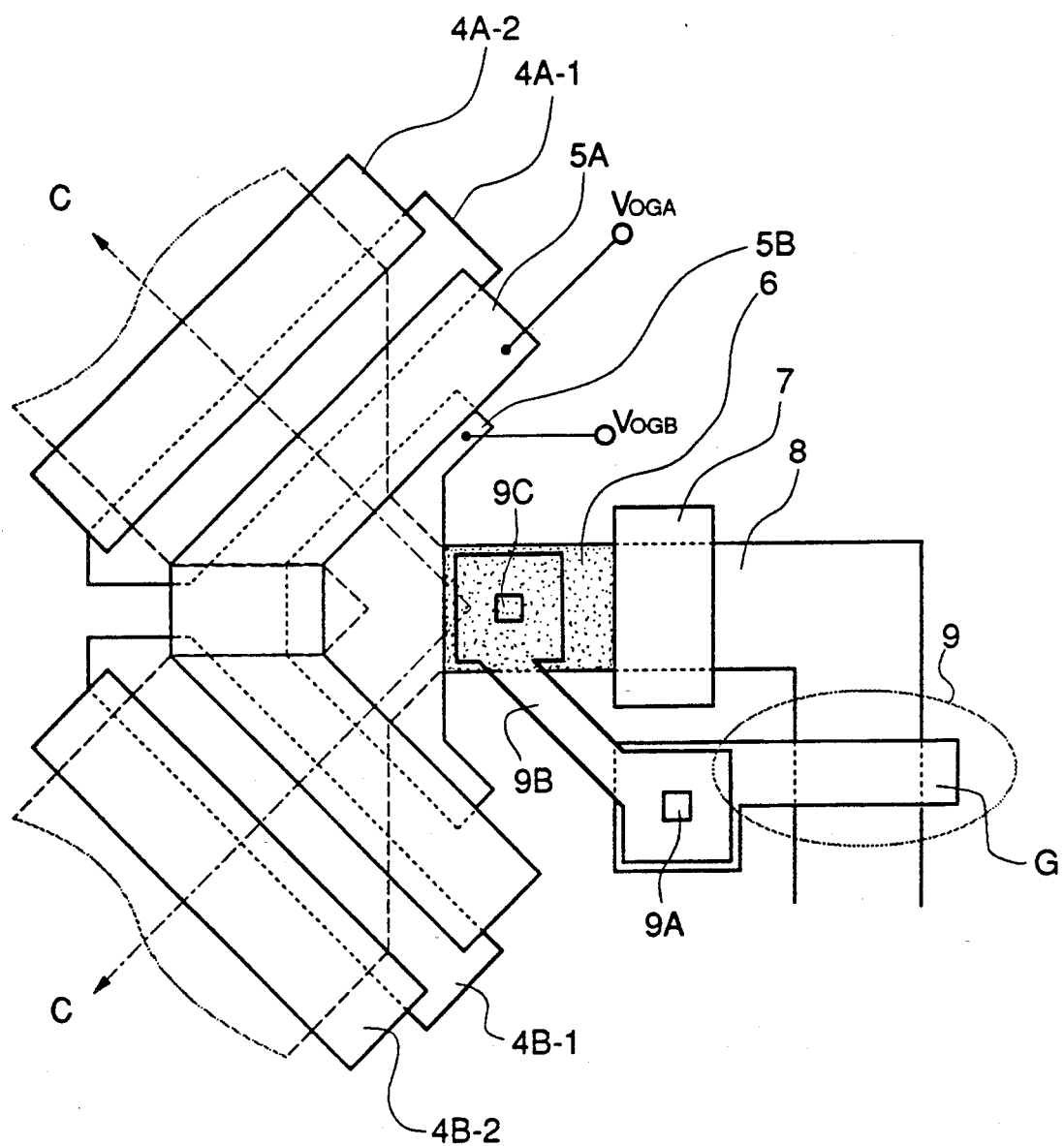
FIG. 2 is a diagrammatic plan view of a first embodiment of the signal charge detection structure in accordance with the present invention for the charge transfer device.
Figure 3A:
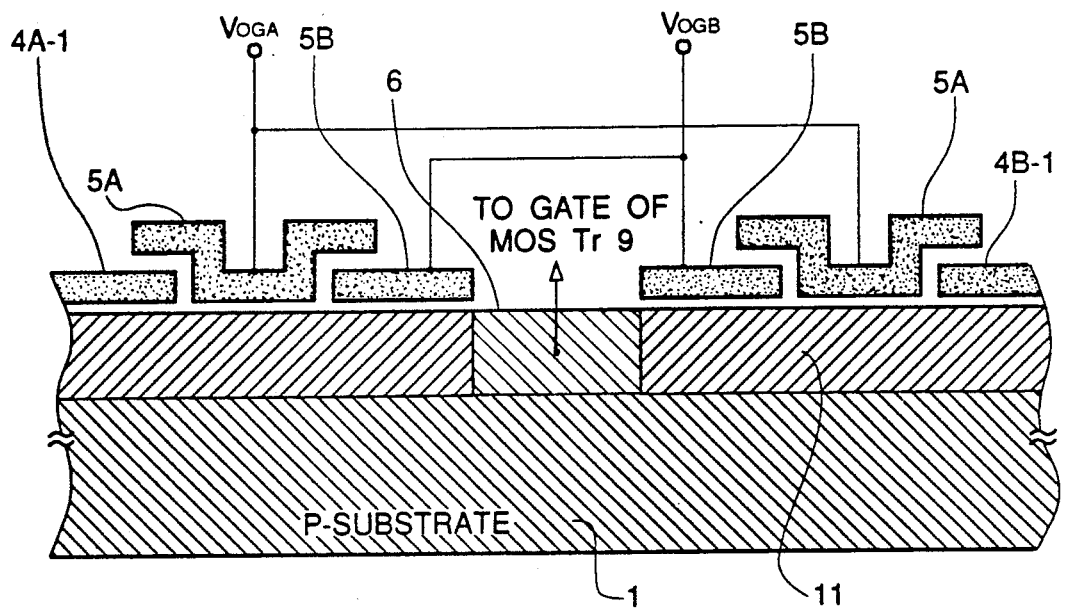
FIG. 3A is a sectional view taken along the line C—C in FIG. 2.

Referring to FIGS. 2 and 3A, FIG. 2 shows a diagrammatic plan view of a first embodiment of the signal charge detection structure in accordance with the present invention for the charge transfer device, and FIG. 3A shows a sectional view taken along the line C—C in FIG. 2. In FIGS. 2 and 3A, elements similar to those shown in FIG. 1 are given the same Reference Numerals, and explanation thereof will be omitted.

The shown first embodiment of the signal charge detection structure in accordance with the present invention includes a floating diffusion or junction 6 which is in the form of a rectangle in a plan view. The floating diffusion or junction 6 is located adjacent to a second output gate 5B, which is formed adjacent a first output gate 5A corresponding to the single output gate 5 shown in FIG. 1. An upper half of the first output gate 5A in FIG. 2 is adjacent to a final stage transfer electrode 4A-1 of the first CCD shift register 4A, and a lower half of the first output gate 5A is adjacent to a final stage transfer electrode 4B-1 of the second CCD shift register 4B.

As seen from the above description and FIGS. 2 and 3A, the signal charges transferred in the first and second CCD shift registers 4A and 4B are separately transferred until the first output gate 5A, but joined by the second output gate 5B. The signal charges joined by the second output gate 5B are transferred to the floating diffusion 6.

As shown in FIG. 2, the first MOS transistor 9 includes a gate electrode G located on the output drain region 8. The gate electrode G of the MOS transistor 9 is connected to the floating diffusion 6 through a contact hole 9A, a connection conductor 9B and another contact hole 9C located and formed as shown.

The first and second output gates 5A and 5B are applied with different voltages $V_{OGA}$ and $V_{OGB}$, respectively, so that a potential $\Phi_{OGB}$ under the output gate 5B is deeper than that a potential $\Phi_{OGA}$ under the output gate 5A.

Figure 3B:
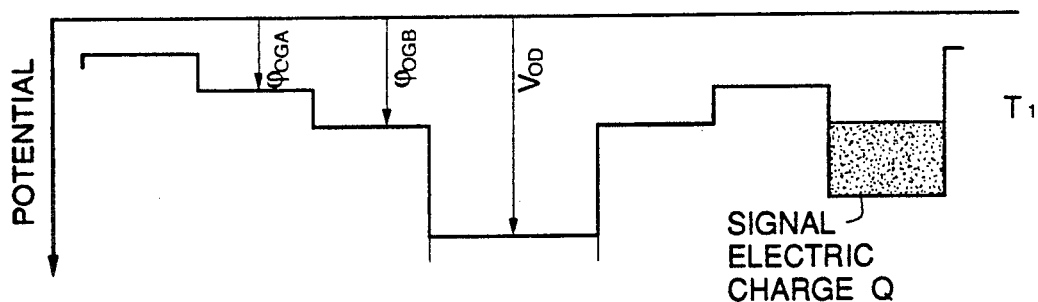
FIGS. 3B and 3C are potential diagrams illustrating potentials at various positions shown in FIG. 3A, at different timings.
Figure 3C:
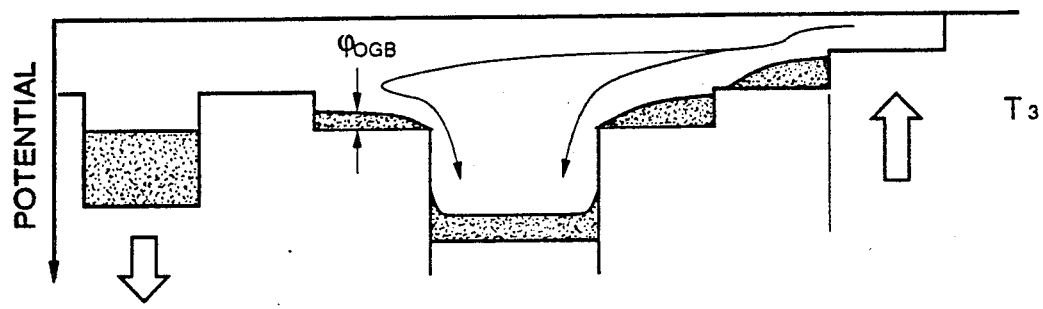
Figure 4:
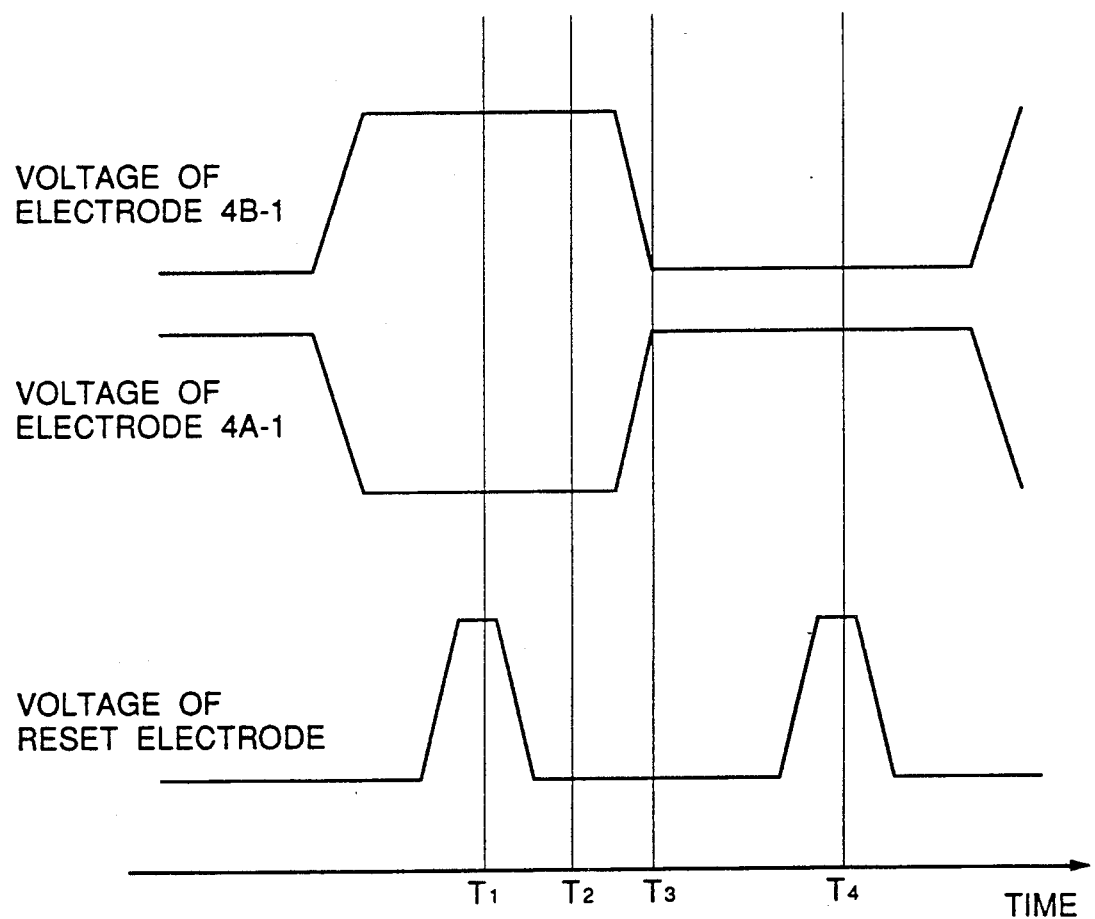
FIG. 4 is a timing chart for illustrating the potential diagrams shown in FIGS. 3B and 3C.

Now, an operation principle will be described with reference to FIG. 3A showing the sectional view taken along the line C—C in FIG. 2, FIGS. 3B and 3C showing potential diagrams illustrating potentials at various positions shown in FIG. 3A, at different timings, and FIG. 4 showing a timing chart for illustrating the potential diagrams shown in FIGS. 3B and 3C.

At a timing $T_1$ (FIG. 3B and FIG. 4), a high level voltage is applied to the reset electrode 7, so as to turn on a channel under the reset electrode 7, so that a potential of the floating diffusion 6 is brought to the same as a voltage $V_{OD}$ applied to the output drain 8. At a timing $T_2$ (FIG. 4), the voltage applied to the reset electrode 7 is brought to a low level, so as turn off the channel under the reset electrode 7, so that the floating diffusion 6 is brought into a floating condition.

At a timing $T_3$ (FIG. 3C and FIG. 4), a voltage of the final stage transfer electrode 4B-1 of the second CCD shift register 4B is brought from a high level to a low level, so that a signal charge Q stored under the final stage transfer electrode 4B-1 is caused to flow, through a transfer channel formed under the output gates 5A and 5B, into the floating diffusion 6. At this timing $T_3$, on the other hand, a voltage of the final stage transfer electrode 4A-1 of the first CCD shift register 4A is brought from a low level to a high level, so as to receive a signal charge from a just preceding transfer electrode 4A-2. Therefore, there is possibility that the signal charge Q reversely flows from the output gates to a potential channel formed under the final stage transfer electrode 4A-1 of the first CCD shift register 4A. In order to prevent this reverse flow or backflow of the signal charge, a potential difference of $\Phi_{OGA} < \Phi_{OGB}$ is given between the channels under the output gates 5A and 5B. With this, a potential barrier is formed, which prevents the electric charge having flowed into the potential channel under the output gate 5B, from flowing out to the potential channel formed under the final stage transfer electrode 4A-1 of the first CCD shift register 4A.

More specifically, if it is set so that an outflow speed of the signal charge from the potential channel under the output gate 5B to the floating diffusion 6 is faster than an inflow speed of the signal charge into the potential channel under the output gate 5B, a rising ($\Delta\Phi_{OGB}$ in FIG. 3C) of the potential under the output gate 5B caused due to the signal charge can be made small. Therefore, in order to prevent the reverse flow of the signal charge, it is sufficient if the following relation holds:

$$(\Phi_{OGB} - \Phi_{OGA}) > \Delta\Phi_{OGB} \approx 0.1 \ V$$

Figure 5:
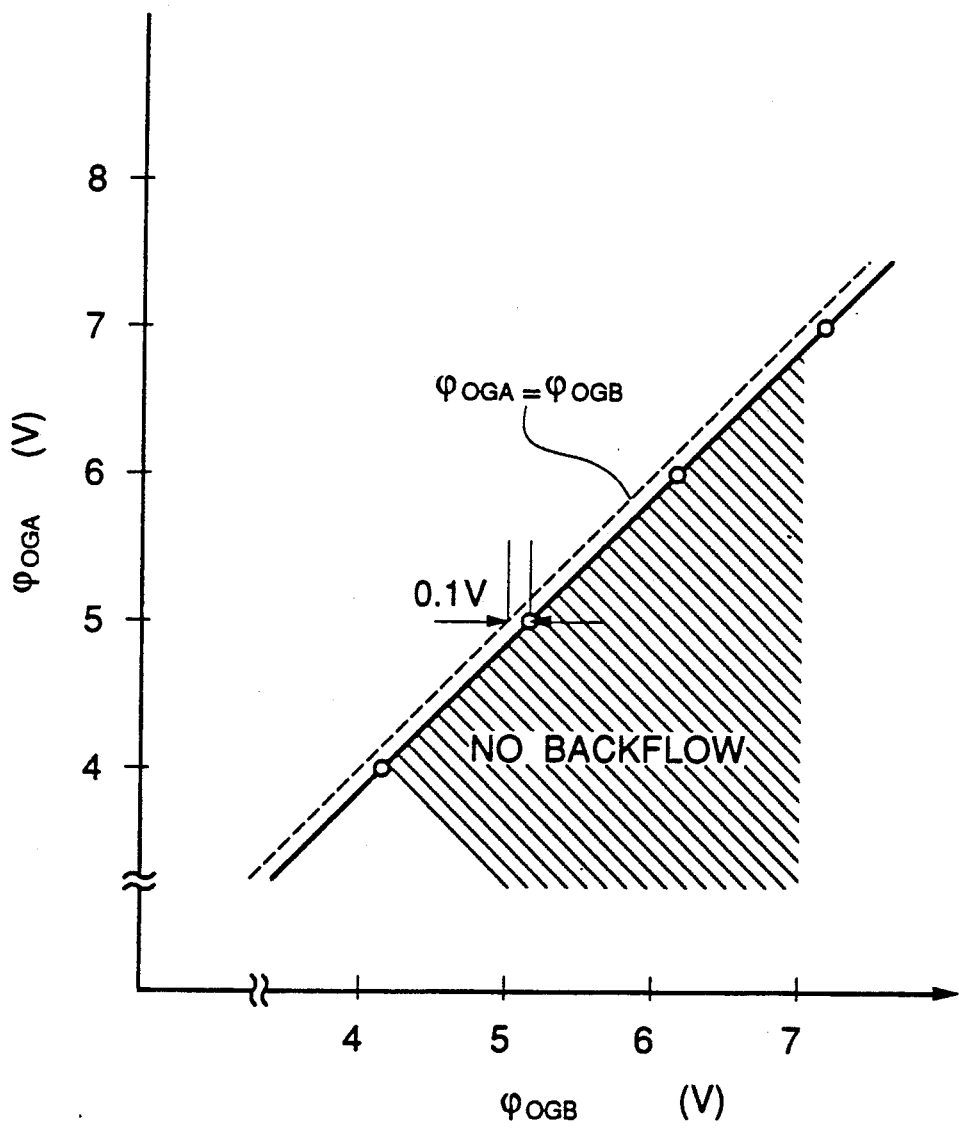
FIG. 5 is a graph illustrating a normal operation zone of the embodiment shown in FIG. 2.

The condition of $\Delta\Phi_{OGB} \approx 0.1$ V would be understood from a graph of FIG. 5 which shows measured values of a signal charge backflow limit.

Figure 6:
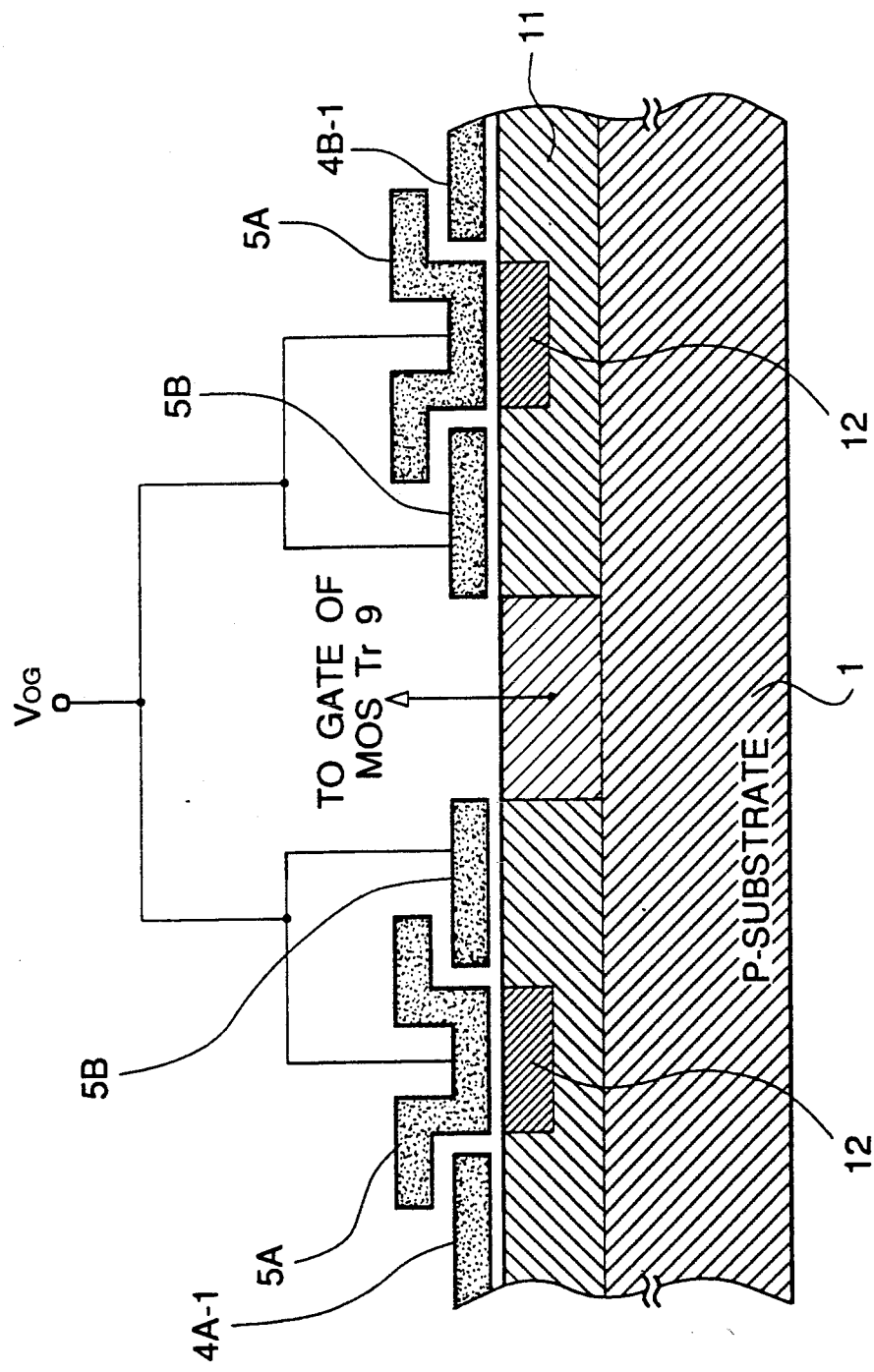
FIG. 6 is a sectional view similar to FIG. 3A, but showing a second embodiment of the signal charge detection structure in accordance with the present invention for the charge transfer device.

Referring to FIG. 6, there is shown a sectional view similar to FIG. 3A, but showing a second embodiment of the signal charge detection structure in accordance with the present invention for the charge transfer device.

In the first embodiment as mentioned above, a potential barrier between the channel under the output gate 5A and the channel under the output gate 5B is realized by applying different voltages $V_{OGA}$ and $V_{OGB}$ to the output gate 5A and the output gate 5B, respectively.

In the second embodiment, on the other hand, a potential barrier between the channel under the output gate 5A and the channel under the output gate 5B is realized by applying the same voltages $V_{OG}$ to both the output gate 5A and the output gate 5B, respectively, but by forming a P-type implanted region 12 under only the output gates 5A.

As seen from the above, the signal charge detection structure in accordance with the present invention for the charge transfer device is characterized in that the signal charges transferred in the pair of CCD shift registers are joined under the output gate, not under the floating diffusion. Therefore, the area of the floating diffusion can be remarkably reduced, and a length of a side of the floating diffusion adjacent to the output gate can be shorted. Accordingly, the capacitances Csub and Ccs in the equation (2) mentioned hereinbefore can be decreased by the reduction of the area of the floating diffusion, and the capacitance $C_{OG}$ can be decreased by the shortening of the length of the side of the floating diffusion adjacent to the output gate. In addition, means for preventing a backflow of the signal charge from the floating diffusion to a non-selected final stage transfer electrode of the pair of CCD shift registers is associated to the output gate assembly composed of the first and second output gates. As a result, the electric charge/voltage conversion gain in the signal charge detection structure of the charge transfer device can be greatly improved.

The invention has thus been shown and described with reference to the specific embodiments. However, it should be noted that the present invention is in no way limited to the details of the illustrated structures but changes and modifications may be made within the scope of the appended claims.

I claim:

1. A signal charge detection circuit for use in a charge transfer device, the charge transfer device including a pair of charge transfer registers which receive signal charges from a photo sensor cell array and which transfer the received signal charges in the same direction along the charge transfer registers, and a floating diffusion type charge reading section for reading the signal charges alternately from final stages of said pair of charge transfer registers, the signal charge detection circuit including an output gate means provided between said final stage of each of said pair of charge transfer registers and a floating diffusion means for causing said signal charges, alternately read from said final stages of said pair of charge transfer registers, to flow through a single channel formed under said output gate means into said floating diffusion, and means for forming an electric field in said channel formed under said output gate means, said electric field acting to forcibly guide said signal charge from the final stage of each of said pair of charge transfer registers to said floating diffusion.

2. The signal charge detection circuit as claimed in claim 1, wherein said output gate means includes a first output gate located adjacent to the final stage of each of said pair of charge transfer registers, said first output gate having a first side adjacent to the final stage of one of said pair of charge transfer registers, and a second side which is independent of said first side and is adjacent to the final stage of the other of said pair of charge transfer registers, and a second output gate having a first side adjacent to a side of said first output gate opposite to said first and second sides of said first output gate, said second output gate also having a second side adjacent to said floating diffusion.

3. The signal charge detection circuit as claimed in claim 2, wherein said electric field forming means applies first and second different voltages to said first and second output gates, respectively, said first voltage is lower than said second voltage.

4. The signal charge detection circuit as claimed in claim 3, wherein said first voltage is lower than said second voltage by a voltage which is larger than 0.1 V.

5. The signal charge detection circuit as claimed in claim 2, wherein said electric field forming means includes an implanted region formed under only one of said first and second output gates.

6. The signal charge detection circuit as claimed in claim 5, wherein said electric field forming means includes an implanted region formed under only said first output gate, said implanted region being of the same conductivity type as that of a selected semiconductor substrate.

* * * * *